US007664012B2

(12) United States Patent
Cohn

(10) Patent No.: US 7,664,012 B2
(45) Date of Patent: Feb. 16, 2010

(54) SOLID-STATE ETHERNET BY-PASS SWITCH CIRCUITRY

(75) Inventor: Philip R. Cohn, Delran, NJ (US)

(73) Assignee: Formation, Inc., Moorestown, NJ (US)

( * ) Notice: Subject to any disclaimer, the term of this patent is extended or adjusted under 35 U.S.C. 154(b) by 483 days.

(21) Appl. No.: 11/383,809

(22) Filed: May 17, 2006

(65) Prior Publication Data

US 2006/0268684 A1 Nov. 30, 2006

Related U.S. Application Data

(60) Provisional application No. 60/682,314, filed on May 18, 2005.

(51) Int. Cl.
*G01R 31/08* (2006.01)
(52) U.S. Cl. ........................................ 370/217; 370/221
(58) Field of Classification Search ........................ None
See application file for complete search history.

(56) References Cited

U.S. PATENT DOCUMENTS 4,620,187 A 10/1986 Conner

| 6,990,319 | B2 | 1/2006 | Wright et al. | |
|---|---|---|---|---|
| 2003/0219025 | A1* | 11/2003 | Choi et al. | 370/401 |
| 2004/0085893 | A1* | 5/2004 | Wang et al. | 370/216 |
| 2006/0077891 | A1* | 4/2006 | Smith et al. | 370/220 |
| 2006/0239183 | A1* | 10/2006 | Robitaille et al. | 370/217 |
| 2007/0025240 | A1* | 2/2007 | Snide | 370/217 |
| 2008/0025292 | A1* | 1/2008 | King et al. | 370/352 |
| 2008/0056253 | A1* | 3/2008 | Minami et al. | 370/389 |

FOREIGN PATENT DOCUMENTS

WO WO 00/28699 5/2000

* cited by examiner

*Primary Examiner*—Phirin Sam
(74) *Attorney, Agent, or Firm*—Panitch Schwarze Belisario & Nadel LLP

(57) ABSTRACT

A solid-state Ethernet by-pass switch includes a first connection that accepts transmit and receive lines from a first Ethernet device, a second connection that accepts transmit and receive lines from a second Ethernet device, a third connection that accepts transmit and receive lines from a third Ethernet device and a solid-state switching device having a normal state and a by-pass state. When configured in the normal state, the solid-state switching device couples the transmit and receive lines from the first connection to the transmit and receive lines from the second connection. When configured in the by-pass state, the solid-state switching device couples the transmit and receive lines from the first connection to the transmit and receive lines from the third connection.

9 Claims, 4 Drawing Sheets

SOLID-STATE ETHERNET BY-PASS SWITCH CIRCUITRY

CROSS REFERENCE TO RELATED APPLICATIONS

This application claims priority to U.S. Provisional Patent Application No. 60/682,314 filed on May 18, 2005 entitled "Solid-State Ethernet By-Pass Switch Circuitry."

BACKGROUND OF THE INVENTION

The present invention relates generally to a by-pass switch circuit for systems with Ethernet interfaces such as those compliant to Institute of Electrical and Electronics Engineers (IEEE) 802.11 Specification, and more particularly, the present invention relates to a solid-state Ethernet by-pass switch circuit for systems with Ethernet interfaces.

Ethernet communications networks are well known in the art. The IEEE has set forth standards for Ethernet networks such as IEEE 802.11. Ethernet communications can occur over hard-wired or wireless local area networks (LANs) as well as wide area networks (WANs). In hardwired communications networks, the wiring is referred to as the "physical layer" and may include wire which is considered to be American National Standards Institute (ANSI)/Telecommunications Industry Association (TIA)/Electronic Industries Alliance (EIA) standard category-3 (CAT-3), category-5 (CAT-5), category-6 (CAT-6) and the like.

An Ethernet by-pass switch is required when an Ethernet device is not operable and must be by-passed to maintain communication between other devices on the network. An Ethernet by-pass switch presents design challenges in providing a rugged, high reliable mechanism to switch Ethernet signals from an input port to an output port in order to maintain the network connectivity.

It is desirable to provide a solid-state Ethernet by-pass switch. It is also desirable to provide a solid-state Ethernet by-pass switch that derives operational power from Ethernet signals without needing external power. Further, it is desirable for the Ethernet by-pass switch to be operational when there is no power from a host Ethernet device.

BRIEF SUMMARY OF THE INVENTION

Briefly stated, an embodiment of the present invention comprises a solid-state Ethernet by-pass switch. The solid-state Ethernet by-pass switch includes a first connection that accepts transmit and receive lines from a first Ethernet device, a second connection that accepts transmit and receive lines from a second Ethernet device, a third connection that accepts transmit and receive lines from a third Ethernet device and a solid-state switching circuit having a normal state and a by-pass state. When configured in the normal state, the solid-state switching circuit couples the transmit and receive lines from the first connection to the transmit and receive lines from the second connection. When configured in the by-pass state, the solid-state switching circuit couples the transmit and receive lines from the first connection to the transmit and receive lines from the third connection.

Another embodiment of the present invention also comprises a solid-state Ethernet by-pass switch having a normal state and a by-pass state. The solid-state Ethernet by-pass switch includes a first connection that accepts transmit and receive lines from a first Ethernet device, a second connection that accepts primary transmit and receive lines from a second Ethernet device, a third connection that accepts transmit and receive lines from a third Ethernet device, and a fourth connection that accepts secondary transmit and receive lines from the second Ethernet device. The solid-state Ethernet by-pass switch includes first, second, third and fourth solid state switching devices. The first solid-state switching device couples the transmit line of the first connection to the receive line of the second connection when configured in the normal state and couples the transmit line of the first connection to the receive line of the third connection when configured in the bypass state. The second solid-state switching device couples the transmit line of the third connection to the receive line of the fourth connection when configured in the normal state and couples the transmit line of the third connection to the receive line of the first connection when configured in the by-pass state. The third solid-state switching device couples the transmit line of the second connection to the receive line of the first connection when configured in the normal state and opens the transmit line of the second connection when configured in the by-pass state. The fourth solid-state switching device couples the transmit line of the fourth connection to the receive line of the third connection when configured in the normal state and opens the transmit line of the fourth connection when configured in the by-pass state.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
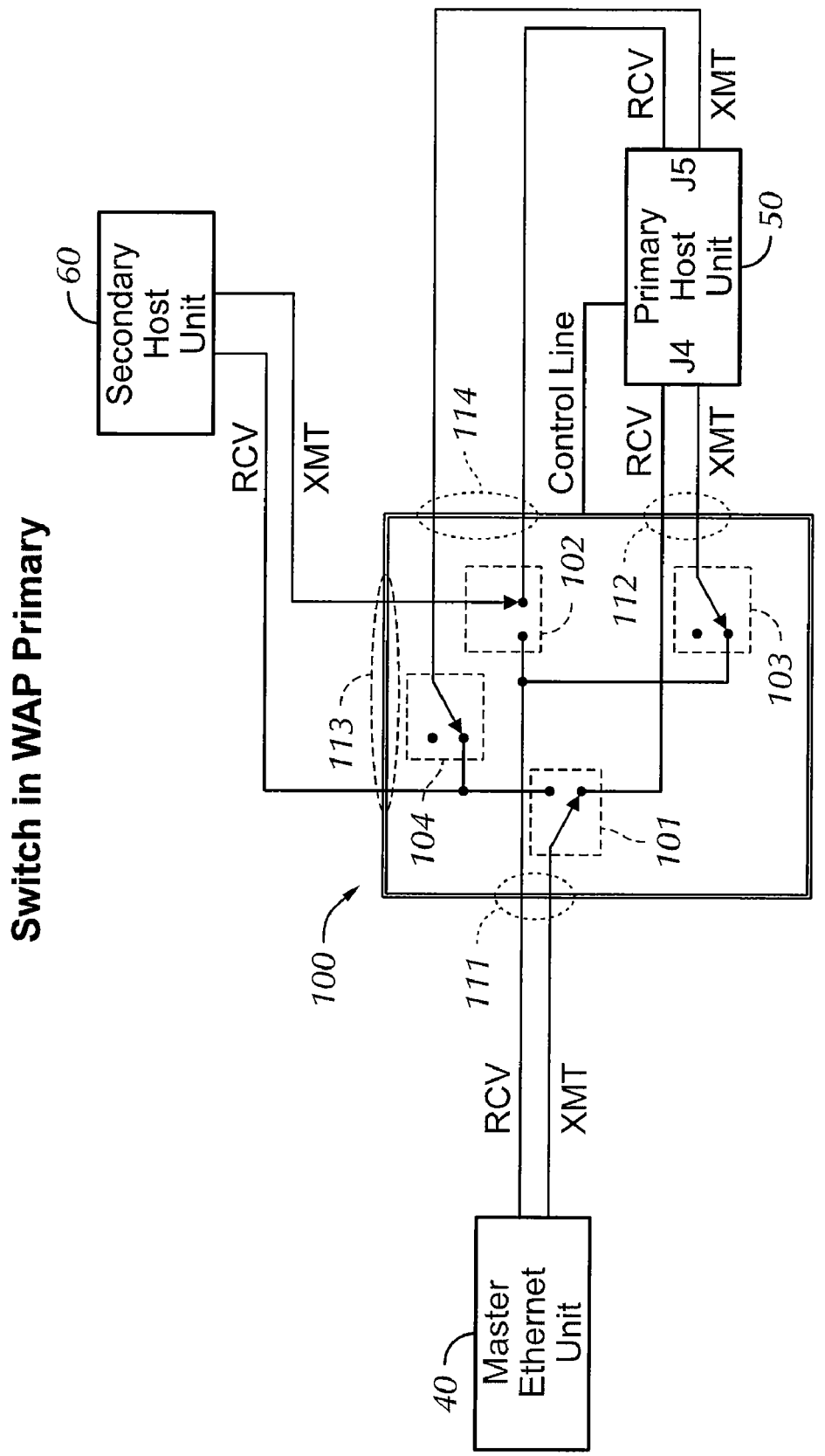
FIG. 1 is a schematic block diagram depicting a solid-state Ethernet by-pass switch in accordance with preferred embodiments of the present invention in a normal state.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a" as used in the claims and in the corresponding portion of the specification, means "at least one."

Figure 2:
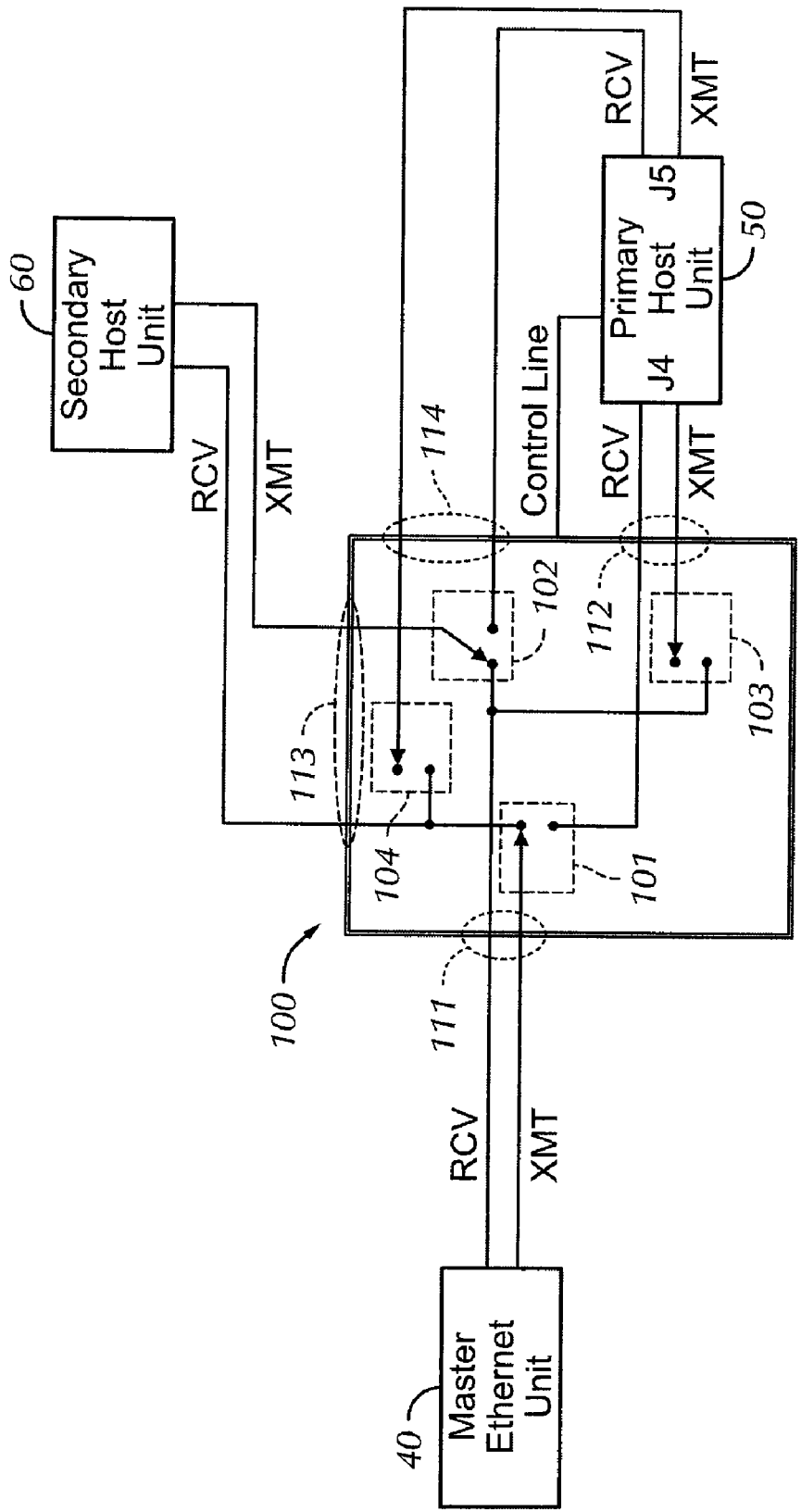
FIG. 2 is a schematic block diagram depicting the solid-state Ethernet by-pass switch of FIG. 1 in a by-pass state.

Referring to FIGS. 1-4 in detail, wherein like numbers refer to like elements throughout, FIG. 1 schematically illustrates a solid-state Ethernet by-pass switch 100 in accordance with preferred embodiments of the present invention. Signals from a master unit 40 of the network are directed to a primary host unit 50 and in turn the primary host unit 50 is able to communicate with a secondary host unit 60. FIG. 1 illustrates the solid-state Ethernet by-pass switch 100 in an "OFF" or "normal state" (i.e., not in by-pass). FIG. 2 schematically illustrates the operation of the solid-state Ethernet by-pass switch 100 when the solid-state Ethernet by-pass switch 100 is in the "ON" or "by-pass state." When the solid-state Ethernet by-pass switch 100 is in the by-pass state, signals from the master unit 40 are routed directly to the secondary host unit 60 thereby by-passing the primary host unit 50.

The solid-state Ethernet by-pass switch 100 includes four switch sections or solid-state switching devices 101-104 which together form a solid-state switching circuit 101-104. Preferably, solid-state switching devices 101 and 102 are identical in circuit composition, and preferably, solid-state switching devices 103 and 104 are identical in circuit composition and are simpler forms of the solid-state switching devices 101 and 102. Alternately, all of the solid-state switching devices 101-104 may be identical in circuit composition or all may be different in circuit composition.

An Ethernet by-pass switch 100 is required when an Ethernet device, such as the primary host unit 50, is not operable or not fully operable and must be "by-passed" to maintain communication between other devices, such as the secondary unit 60, on the Ethernet communications network, such as between the master Ethernet unit 40 and the secondary host unit 60. The Ethernet by-pass switch 100 presents design challenges in providing a rugged, high reliable mechanism to switch Ethernet signals from an input port 111 to an output port 112, 113 in order to maintain the network connectivity. The design must be operational when there is no power from the primary host unit 50. The Ethernet by-pass switch 100 preferably operates in harsh environments, such as within the equipment bay of an aircraft where shock and vibration can greatly stress traditional electro-mechanical solutions to the by-pass requirement.

Thus, broadly, the solid-state Ethernet by-pass switch 100 includes a first connection 111 that accepts transmit and receive lines XMT, RCV from a first Ethernet device (master Ethernet unit) 40; a second connection 112 that accepts transmit and receive lines XMT, RCV from a second Ethernet device (primary host unit) 50; a third connection 113 that accepts transmit and receive lines XMT, RCV from a third Ethernet device (secondary host unit) 60; and a solid-state switching circuit comprising solid state switching devices 101-104 having a normal state and a by-pass state. When configured in the normal state, the solid-state switching circuit 101-104 couples the transmit and receive lines XMT, RCV from the first connection 111 to the transmit and receive lines XMT, RCV from the second connection 112. When configured in the by-pass state, the solid-state switching circuit 101-104 couples the transmit and receive lines XMT, RCV from the first connection 111 to the transmit and receive lines XMT, RCV from the third connection 113. The solid-state Ethernet by-pass switch 100 further includes a fourth connection 114 that accepts secondary transmit and receive lines XMT, RCV from the second Ethernet device 50. When configured in the normal state, the solid-state switching circuit 101-104 couples the transmit and receive lines XMT, RCV from the fourth connection 114 to the transmit and receive lines XMT, RCV from the third connection 113. When configured in the by-pass state, the solid-state switching circuit 101-104 renders the second connection 112 and the fourth connection 114 effectively "open-circuited" with respect to the first and third connections 111, 113, i.e., not connected to another connection 111, 113.

In particular, the first solid-state switching device 101 couples the transmit line XMT of the first connection 111 to the receive line RCV of the second connection 112 when configured in the normal state and couples the transmit line XMT of the first connection 111 to the receive line RCV of the third connection 113 when configured in the bypass state. The second solid-state switching device 102 couples the transmit line XMT of the third connection 113 to the receive line RCV of the fourth connection 114 when configured in the normal state and couples the transmit line XMT of the third connection 113 to the receive line RCV of the first connection 111 when configured in the by-pass state. The third solid-state switching device 103 couples the transmit line XMT of the second connection 112 to the receive line RCV of the first connection 111 when configured in the normal state and opens the transmit line XMT of the second connection 112 when configured in the by-pass state. The fourth solid-state switching device 104 couples the transmit line XMT of the fourth connection 114 to the receive line RCV of the third connection 113 when configured in the normal state and "opens" the transmit line XMT of the fourth connection 114 when configured in the by-pass state. The second connection 112 and the fourth connection 114 may be normally resident in the host device 50 which is required to be by-passed.

The solid-state Ethernet by-pass switch 100 is designed to operate as a "fail-safe" device in that it automatically switches to the "by-pass" state when power is removed from the primary host unit 50. The Solid-state Ethernet by-pass switch 100 is configured to allow the primary host unit 50 to be by-passed when either (i) power is lost or (ii) a control signal is not asserted.

The solid-state Ethernet by-pass switch 100 is also symmetrical in its architecture and the predisposition of the lines of the transmit XMT and the receive RCV pair need not be known for proper operation. Therefore, the solid-state Ethernet by-pass switch 100 also includes "Auto-Crossover" switching of the transmit XMT and the receive RCV functions.

The solid-state Ethernet by-pass switch 100 uses a plurality of Field Effect Transistors (FETs) M1-M32 (FIGS. 3-4) and contains circuitry which "self-biases" the FETs M1-M32 by sampling the Ethernet differential lines XMT, RCV to provide the necessary bias for the operation of the FETs M1-M10. Thus, the solid-state Ethernet by-pass switch 100 (parasitically) derives power from the Ethernet signals. In other words, the solid-state Ethernet by-pass switch 100 is powered from the Ethernet signal power itself with no other external or internal source of power. A control signal is able to disable the by-pass path and establish a non-by-pass path. In this manner, the by-pass is accomplished with a self-energizing circuit that requires no external power source.

Figure 3:
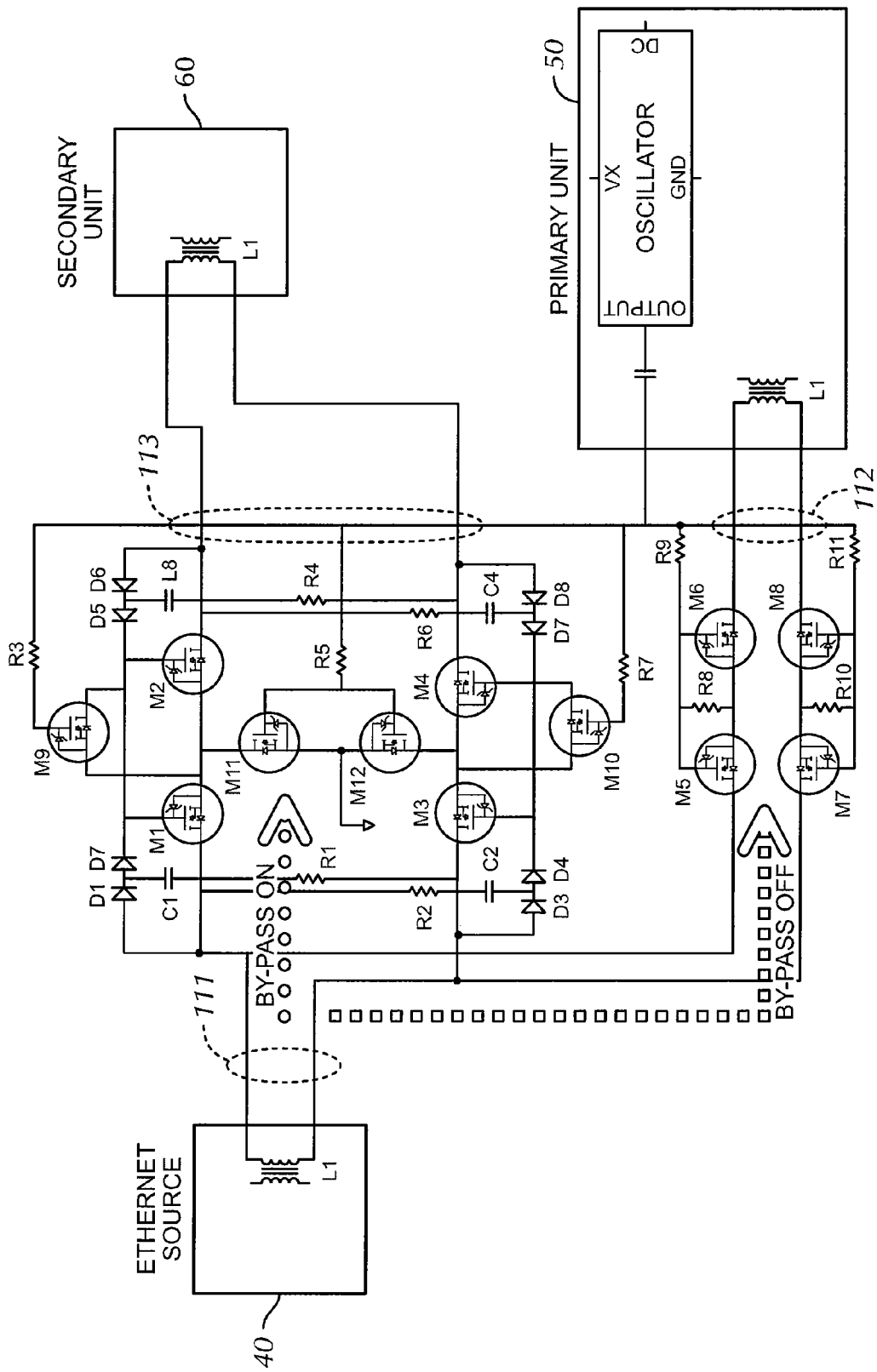
FIG. 3 is an electrical schematic diagram of a detailed implementation of a transmit portion of a control circuit for an Ethernet by-pass switch in accordance with the present invention.

A detailed implementation of a transmit portion of the Ethernet by-pass switch 100 is depicted in FIG. 3. A receive portion of the Ethernet by-pass switch 100 would be similarly implemented. As shown in FIG. 3, the by-pass path has a bias network that samples the Ethernet signal and provides sufficient voltage to turn ON FETs M1, M2, M3, and M4. This establishes a low impedance path to the secondary unit 60. FET devices M5, M6, M7 and M8 receive no bias and are in the OFF or high impedance state. This condition is required to maintain proper termination of the Ethernet cable at all times. An inductor L1 graphically represents the load of each of the Ethernet source unit 40, primary host unit 50 and secondary host unit 60, for simplicity, but any known circuitry may be utilized therein.

As long as the primary host unit 50 is operational, a control signal is generated which causes: (i) FETs M9 and M10 to be biased ON which results in shutting off devices M1, M2, M3 and M4; (ii) FETs M11 and M12 to be biased ON to terminate the Ethernet path so capacitive coupling cannot occur through the unselected path; and (iii) FETs M5, M6, M7 and M8 to be biased ON to direct the Ethernet signal to the designated port or connection 111-113.

Figure 4:
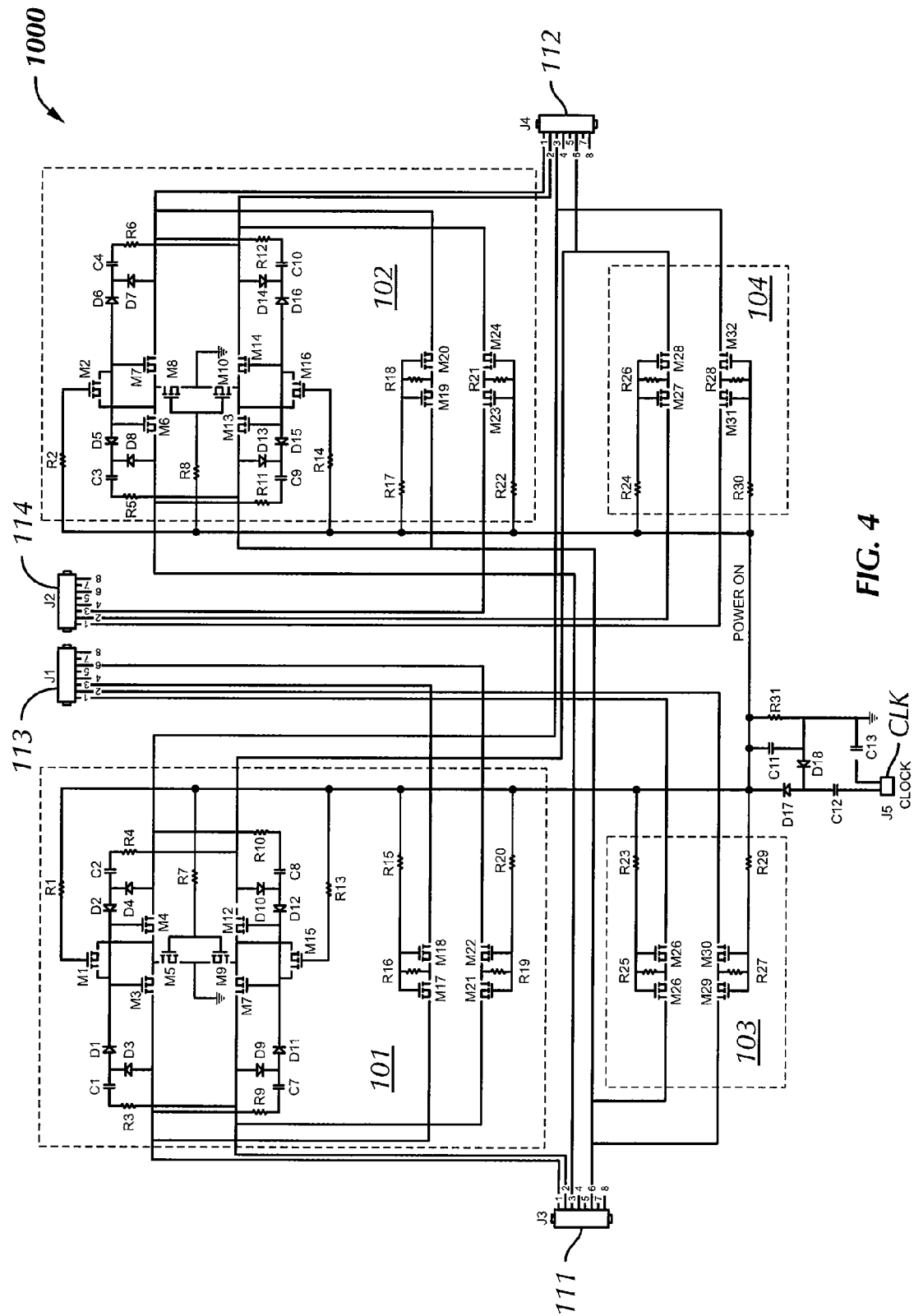
FIG. 4 is an electrical schematic of a detailed implementation of a control circuit for an Ethernet by-pass switch in accordance with the present invention.

A detailed implementation of a solid-state Ethernet by-pass switch 1000 is shown in FIG. 4 which depicts the interconnectivity that is required to satisfy the requirements to properly switch the signals associated with an Ethernet network. As shown in FIG. 4, sections 103 and 104 are simpler versions of sections 101 and 102. Sections 103 and 104 are only activated when the host power is present so self-biasing circuitry is therefore not required. Using an available clock CLK and alternating current (AC)-coupling the clock CLK into the circuitry of the solid-state Ethernet by-pass switch 1000 generates the control signal. The clock CLK is detected and used to disable the by-pass state, i.e., to energize the solid-state switching devices into the normal state.

The solid-state Ethernet by-pass switch 100, 1000 (i) provides highly reliable electrical connectivity, and (ii) due to the lack of moving parts, the solid-state Ethernet by-pass switch 100, 1000 is able to tolerate higher levels of shock and vibration.

While the present invention with its solid-state design was conceived to operate in harsh environments, such as within the equipment bay of an aircraft where shock and vibration can greatly stress electro-mechanical solutions, the solid-state Ethernet by-pass switch 100, 1000 may have many other applications and the applications should not be construed as limiting. For example, the solid-state Ethernet by-pass switch 100, 1000 may be utilized in any LAN, WAN or other Ethernet communications network.

From the foregoing, it can be seen that the present invention is directed to a solid-state Ethernet by-pass switch. Moreover, it can be seen that the present invention is directed to a solid-state Ethernet by-pass switch that derives power from Ethernet signals without needing external power. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A solid-state Ethernet by-pass switch comprising:
a first connection that accepts transmit and receive lines from a first Ethernet device;
a second connection that accepts transmit and receive lines from a second Ethernet device;
a third connection that accepts transmit and receive lines from a third Ethernet device; and
a solid-state switching circuit having a normal state and a by-pass state, the solid-state Ethernet by-pass switch deriving power from Ethernet signals without needing external power,
such that, when configured in the normal state, the solid-state switching circuit couples the transmit and receive lines from the first connection to the transmit and receive lines from the second connection, and
when configured in the by-pass state, the solid-state switching circuit couples the transmit and receive lines from the first connection to the transmit and receive lines from the third connection.

2. The solid-state Ethernet by-pass switch according to claim 1, further comprising:
a fourth connection that accepts secondary transmit and receive lines from the second Ethernet device.

3. The solid-state Ethernet by-pass switch according to claim 1, wherein:
when configured in the normal state, the solid-state switching circuit couples the transmit and receive lines from the fourth connection to the transmit and receive lines from the third connection, and
when configured in the by-pass state, the solid-state switching circuit renders the second connection and the fourth connection effectively open-circuited with respect to the first and third connections.

4. The solid-state Ethernet by-pass switch according to claim 1, further comprising:
a clock signal that is coupled to the solid state switching circuit, the solid-state switching circuit being set into the normal state by detection of the clock signal.

5. The solid-state Ethernet by-pass switch according to claim 1, wherein the solid-state switching circuit includes a plurality of field-effect transistors (FETs).

6. A solid-state Ethernet by-pass switch having a normal state and a by-pass state, the solid-state Ethernet by-pass switch comprising:
a first connection that accepts transmit and receive lines from a first Ethernet device;
a second connection that accepts primary transmit and receive lines from a second Ethernet device;
a third connection that accepts transmit and receive lines from a third Ethernet device;
a fourth connection that accepts secondary transmit and receive lines from the second Ethernet device;
a first solid-state switching device coupling the transmit line of the first connection to the receive line of the second connection when configured in the normal state and coupling the transmit line of the first connection to the receive line of the third connection when configured in the bypass state;
a second solid-state switching device coupling the transmit line of the third connection to the receive line of the fourth connection when configured in the normal state and coupling the transmit line of the third connection to the receive line of the first connection when configured in the by-pass state;
a third solid-state switching device coupling the transmit line of the second connection to the receive line of the first connection when configured in the normal state and opening the transmit line of the second connection when configured in the by-pass state; and
a fourth solid-state switching device coupling the transmit line of the fourth connection to the receive line of the third connection when configured in the normal state and opening the transmit line of the fourth connection when configured in the by-pass state.

7. The solid-state Ethernet by-pass switch according to claim 6, wherein each of the first, second, third and fourth solid-state switching devices includes at least one field-effect transistor (FET).

8. The solid-state Ethernet by-pass switch according to claim 6, wherein the solid-state Ethernet by-pass switch derives power from Ethernet signals without needing external power.

9. The solid-state Ethernet by-pass switch according to claim 6, further comprising:
a clock signal that is coupled to each of the first, second, third and fourth solid-state switching devices, the first, second, third and fourth solid-state switching devices being set into the normal state by detection of the clock signal.

* * * * *

UNITED STATES PATENT AND TRADEMARK OFFICE
CERTIFICATE OF CORRECTION

PATENT NO. : 7,664,012 B2 Page 1 of 1
APPLICATION NO. : 11/383809
DATED : February 16, 2010
INVENTOR(S) : Philip R. Cohn It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 758 days.

Signed and Sealed this

Thirtieth Day of November, 2010

David J. Kappos
*Director of the United States Patent and Trademark Office*